United States Patent
Huang et al.

(10) Patent No.: US 11,039,521 B1
(45) Date of Patent: Jun. 15, 2021

(54) PROXIMITY SENSOR WITH A SLICED INTEGRATION TIME SENSING MECHANISM AND SENSING METHOD THEREOF

(71) Applicant: ANPEC ELECTRONICS CORPORATION, Hsinchu (TW)

(72) Inventors: Yi-Jung Huang, Hsinchu (TW); Jing-Min Chen, Hsinchu (TW); Chih-Ning Chen, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/833,773

(22) Filed: Mar. 30, 2020

(30) Foreign Application Priority Data

Dec. 11, 2019 (TW) .................................. 108145210

(51) Int. Cl.
*H05B 47/11* (2020.01)
*H05B 47/195* (2020.01)
*H01S 5/183* (2006.01)

(52) U.S. Cl.
CPC ........... *H05B 47/11* (2020.01); *H05B 47/195* (2020.01); *H01S 5/183* (2013.01)

(58) Field of Classification Search
CPC ........ H05B 47/11; H05B 47/195; H01S 5/183
See application file for complete search history.

(56) References Cited

U.S. PATENT DOCUMENTS

| 2011/0163233 | A1* | 7/2011 | Ng | G01J 5/20 |
| | | | | 250/338.4 |
| 2013/0341494 | A1* | 12/2013 | Fadell | G06F 3/0383 |
| | | | | 250/214 AL |
| 2015/0334372 | A1* | 11/2015 | Kim | G06T 15/506 |
| | | | | 348/46 |
| 2016/0061588 | A1* | 3/2016 | Cho | G06F 1/1626 |
| | | | | 356/614 |
| 2019/0293792 | A1* | 9/2019 | Keel | G01S 7/491 |
| 2020/0253031 | A1* | 8/2020 | Baker | H04N 5/23206 |

* cited by examiner

Primary Examiner — Borna Alaeddini
(74) Attorney, Agent, or Firm — Li & Cai Intellectual Property (USA) Office

(57) ABSTRACT

A proximity sensor with a sliced integration time sensing mechanism and a sensing method thereof are provided. A light transmitter emits a sensing light toward a detected object during a first phase time. A light receiver receives a first light signal formed by the sensing light reflected by the detected object and an ambient light during the first phase time, and receives a second light signal of the ambient light during a second phase time. A first brightness of the first light signal is integrated over the first phase time to form a first integrated brightness value. A second brightness of the second light signal is integrated over the second phase time to form a second integrated brightness value. The light receiver subtracts the second integrated brightness value from the first integrated brightness value to obtain a first integrated brightness correction value by phase cancellation.

10 Claims, 10 Drawing Sheets

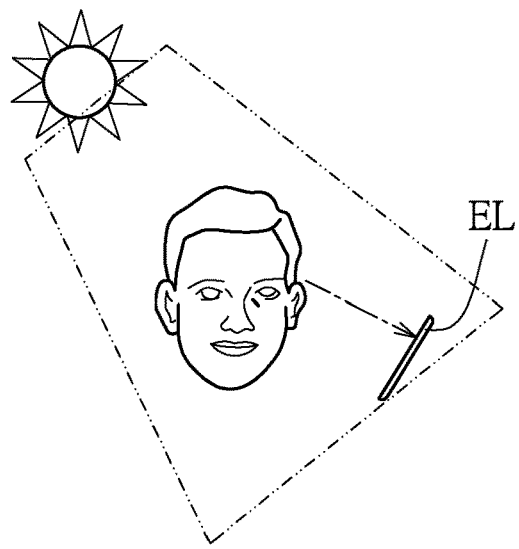
FIG. 5A
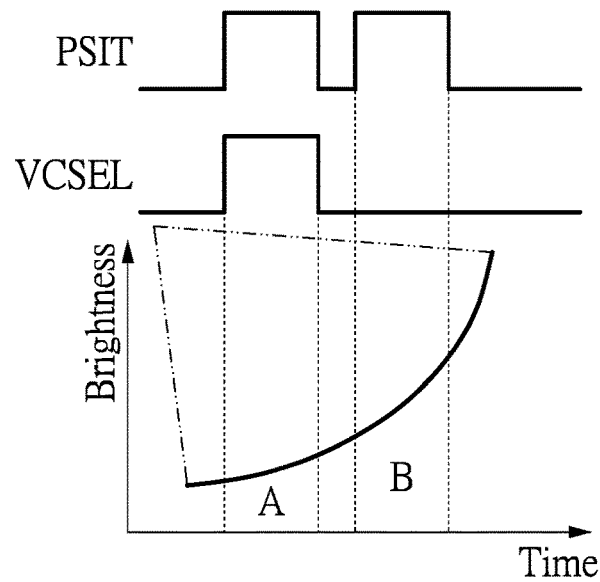
FIG. 5B
$\Phi_1 - \Phi_2 = A - B =$
FIG. 5C $\Phi_1 - \Phi_2 + \Phi_3$
$= A-(B+C)+D+E-(F+G)+H$
$= A-B-C+D+E-F-G+H$
$= (A-B)-(C-D)+(E-F)-(G-H)$

PROXIMITY SENSOR WITH A SLICED INTEGRATION TIME SENSING MECHANISM AND SENSING METHOD THEREOF

CROSS-REFERENCE TO RELATED PATENT APPLICATION

This application claims the benefit of priority to Taiwan Patent Application No. 108145210, filed on Dec. 11, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a proximity sensor, and more particularly to a proximity sensor with a sliced integration time sensing mechanism and a sensing method thereof.

BACKGROUND OF THE DISCLOSURE

Cell phones having a touch screen are becoming more and more popular. When a user makes a call, a face of the user may easily touch the touch screen of the cell phone to inadvertently trigger the cell phone to perform an operation. Therefore, a light proximity sensor is often installed in the cell phone. When the light proximity sensor detects that light is blocked, a system of the cell phone determines that the face is too close to the touch screen, and thus the touch screen is turned off, thereby preventing the cell phone from being triggered unexpectedly by being touched with the face, and saving a power of the cell phone during the call.

SUMMARY OF THE DISCLOSURE

In response to the above-referenced technical inadequacies, the present disclosure provides a proximity sensor with a sliced integration time sensing mechanism. The proximity sensor is disposed in an electronic device and applicable to sense a distance between the electronic device and a detected object. The proximity sensor includes a light transmitter and a light receiver. The light transmitter is configured to emit a sensing light toward the detected object during a first phase time. An integration time indicated by an integration time signal is divided into a plurality of phase times including the first phase time and a second phase time. The light receiver is disposed in a path along which the sensing light is reflected by the detected object. The light receiver is configured to receive a first light signal formed by the sensing light reflected by the detected object and an ambient light during the first phase time. The light receiver is configured to receive a second light signal of the ambient light during the second phase time. A first brightness of the first light signal is integrated over the first phase time to form a first integrated brightness value. A second brightness of the second light signal is integrated over the second phase time to form a second integrated brightness value. The light receiver is configured to subtract the second integrated brightness value from the first integrated brightness value to obtain a first integrated brightness correction value by phase cancellation.

In certain embodiments, the phase times have the same time length.

In certain embodiments, the plurality of phase times further includes a third phase time. The light transmitter is configured to emit the sensing light toward the detected object during the third phase time. The light receiver is configured to receive a third light signal formed by the sensing light reflected by the detected object and the ambient light during the third phase time. A third brightness of the third light signal is integrated over the third phase time to form a third integrated brightness value. The light receiver is configured to calculate a sum of the first integrated brightness correction value and the third integrated brightness value to obtain a second integrated brightness correction value.

In certain embodiments, a time length of the second phase time is equal to a sum of a time length of the first phase time and a time length of the third phase time.

In certain embodiments, the first phase time is divided into a plurality of first sub-phase times. The second phase time is divided into a plurality of second sub-phase times. The first sub-phase times are interleaved with the second sub-phase times.

In addition, the present disclosure provides a slice integration time sensing method for a proximity sensor, wherein the proximity sensor is disposed in an electronic device and applicable to sense a distance between the electronic device and a detected object. The slice integration time sensing method includes the following steps: dividing an integration time indicated by an integration time signal into a first phase time and a second phase time; emitting a sensing light toward the detected object during the first phase time; receiving a first light signal formed by the sensing light reflected by the detected object and an ambient light, during the first phase time; receiving a second light signal of the ambient light during the second phase time; and integrating a first brightness of the first light signal over the first phase time to obtain a first integrated brightness value, integrating a second brightness of the second light signal over the second phase time to obtain a second integrated brightness value, and subtracting the second integrated brightness value from the first integrated brightness value to obtain a first integrated brightness correction value by phase cancellation.

In certain embodiments, the slice integration time sensing method further includes a step of: dividing the integration time into the plurality of phase times have the same time length.

In certain embodiments, the slice integration time sensing method further includes steps of: dividing the integration time into the first phase time, the second phase time and a third phase time; emitting the sensing light toward the detected object during the third phase time; receiving a third light signal formed by the sensing light reflected by the detected object and the ambient light, during the third phase time; and integrating a third brightness of the third light signal over the third phase time to obtain a third integrated brightness value, and calculating a sum of the first integrated brightness correction value and the third integrated brightness value.

In certain embodiments, a time length of the second phase time is equal to a sum of a time length of the first phase time and a time length of the third phase time.

In certain embodiments, the slice integration time sensing method further includes steps of: dividing the first phase time into a plurality of first sub-phase times; dividing the second phase time into a plurality of second sub-phase times; and interleaving the first sub-phase times with the second sub-phase times.

As described above, the present disclosure provides the proximity sensor with the sliced integration time sensing mechanism and the sensing method thereof. The integration time is divided into the plurality of phase times such as two, three or more phase times. The light transmitter emits the sensing light and the light receiver receives the light signal formed by the sensing signal reflected by the detected object and the ambient light during a specific phase time. The light receiver only receives the light signal formed by the ambient light during other phase times. Finally, the brightness of the ambient light is optimally eliminated from the brightness of the light signals formed during the plurality of phase times by the phase cancellation manner such as the two-phase or three-phase cancellation manner.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 5A is a schematic diagram of a proximity sensor with a sliced integration time sensing mechanism sensing an electronic device gradually moving away from a human body over time according to a third embodiment of the present disclosure.

FIG. 5B is a schematic diagram of waveforms of an integration time signal and a light emitting signal of the proximity sensor with the sliced integration time sensing mechanism and a curve of a light signal versus time according to the third embodiment of the present disclosure.

FIG. 5C is a schematic diagram of a second integrated brightness area subtracted from a first integrated brightness area of FIG. 5B.

DETAILED DESCRIPTION OF THE EXEMPLARY EMBODIMENTS

Figure 1:
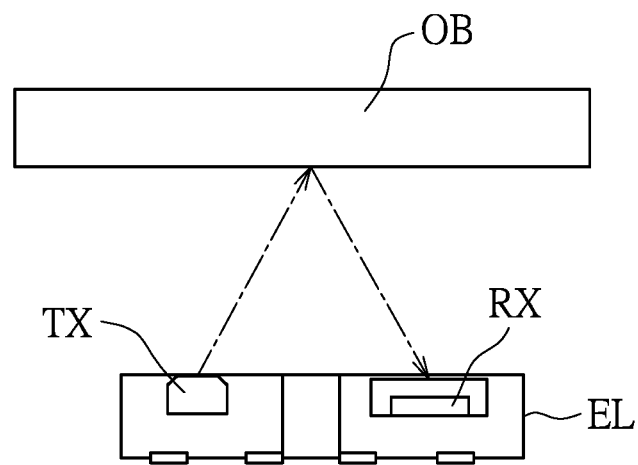
FIG. 1 is a schematic diagram of a proximity sensor with a sliced integration time sensing mechanism for sensing a distance between an electronic device and a detected object according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
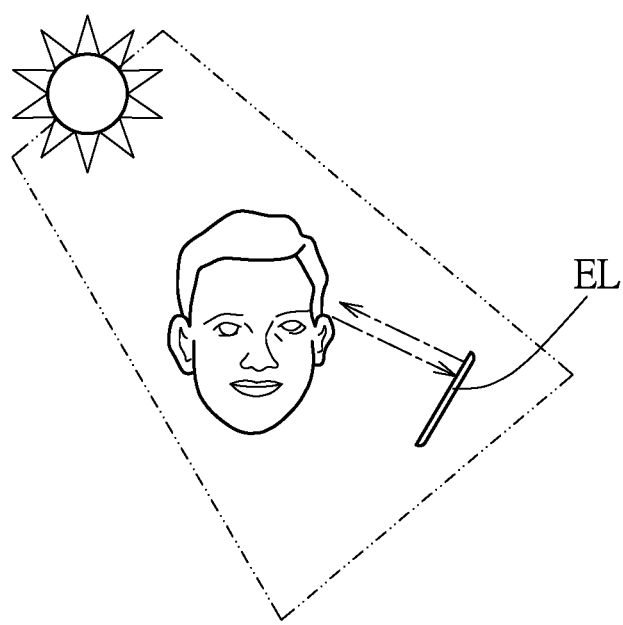
FIG. 2 is a schematic diagram of the proximity sensor with the sliced integration time sensing mechanism for sensing a distance between the electronic device and a human body according to the first embodiment of the present disclosure.

Reference is made to FIGS. 1 and 2, wherein FIG. 1 is a schematic diagram of a proximity sensor with a sliced integration time sensing mechanism for sensing a distance between an electronic device and a detected object according to a first embodiment of the present disclosure, and FIG. 2 is a schematic diagram of the proximity sensor with the sliced integration time sensing mechanism for sensing a distance between the electronic device and a human body according to the first embodiment of the present disclosure.

As shown in FIG. 1, in the embodiment, the proximity sensor with the sliced integration time sensing mechanism includes a light transmitter TX and a light receiver RX. The proximity sensor is disposed an electronic device EL and applicable to sense a distance between the electronic device EL and a detected object OB. As shown in FIG. 2, the detected object OB may be a human body, but the present disclosure is not limited thereto.

As shown in FIGS. 1 and 2, the light transmitter TX is configured to emit a sensing light toward the detected object OB such as the human body. For example, the light transmitter TX is an infrared light emitting diode for emitting an infrared light, but the present disclosure is not limited thereto. As shown in FIG. 1, the light receiver RX is disposed in a path along which the sensing light is reflected by the detected object OB relative to the light transmitter TX.

Figure 3:
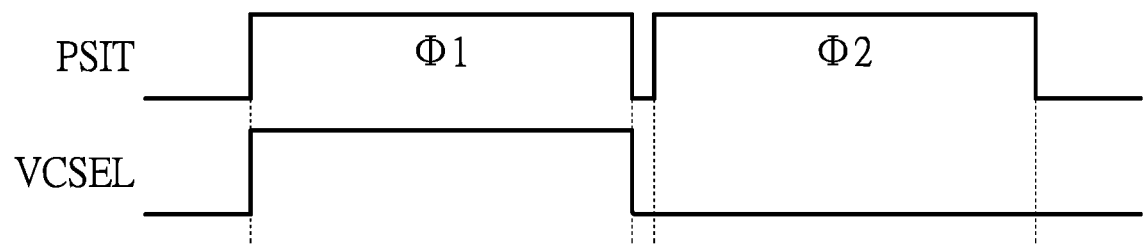
FIG. 3 is a waveform diagram of an integration time signal and a light emitting signal of the proximity sensor with the sliced integration time sensing mechanism according to the first embodiment of the present disclosure.

Reference is made to FIGS. 1 to 3, wherein FIG. 3 is a waveform diagram of an integration time signal and a light emitting signal of the proximity sensor with the sliced integration time sensing mechanism according to the first embodiment of the present disclosure.

A brightness of the sensing light emitted by the light transmitter TX and a brightness of an ambient light may change over an integration time during working periods of waveforms of an integration time signal PSIT. In the embodiment, the integration time is divided into a plurality of phase times. For example, as shown in FIG. 3, the integration time is divided into two phase times. That is, the plurality of phase times divided from the integration time may include a first phase time $\Phi 1$ and a second phase time $\Phi 2$, but the present disclosure is not limited thereto.

As shown in FIG. 3, a light emitting signal VCSEL is at a high level during the first phase time $\Phi 1$, which indicates that the light transmitter TX emits the sensing light toward the detected object OB during the first phase time $\Phi 1$.

When the light transmitter TX emits the sensing light toward the detected object OB, an ambient light source may emit the ambient light. Under this condition, the light receiver RX receives a first light signal formed by the sensing light reflected by the detected object OB and the ambient light of the ambient light source during the first phase time $\Phi 1$.

Conversely, the light emitting signal VCSEL is at a low level during the second phase time $\Phi 2$, which indicates that the light transmitter TX does not emit any light during the second phase time $\Phi 2$. Under this condition, the light receiver RX only receives a second light signal formed by the ambient light during the second phase time $\Phi 2$.

The light receiver RX is disposed in the electronic device EL. Therefore, it should be understood that, when the electronic device EL is located at different environments at different time points, the brightness of the ambient light received by the light receiver RX may change. In addition, the brightness of the ambient light received by the light receiver RX may change with a distance between the electronic device EL and the detection object OB.

In the embodiment, the proximity sensor determines the distance between the electronic device EL and the detected object OB, according to the brightness of the light signal formed by reflecting the sensing light emitted by the light transmitter TX back to the light receiver RX by the detected object OB. Therefore, the brightness of the ambient light must be subtracted from the brightness of the first light signal received by the light receiver RX.

A first brightness of the first light signal is integrated over the first phase time $\Phi 1$ to obtain a first integrated brightness value. A second brightness of the second light signal is integrated over the second phase time $\Phi 2$ to obtain a second integrated brightness value. The light receiver RX of the proximity sensor subtracts the second integrated brightness value (that is the brightness of the ambient light) from the first integrated brightness value to obtain a first integrated brightness correction value by phase cancellation.

The first integrated brightness correction value is only the brightness of the light signal formed by reflecting the sensing light emitted by the light transmitter TX by the detected object OB over time without the brightness of the ambient light. Therefore, the proximity sensor can precisely determine the distance between the electronic device EL and the detected object OB according to the first integrated brightness correction value to determine an operation of the electronic device EL. For example, when the electronic device EL is too close to a face of a user, a touch screen of the electronic device EL is turned off, thereby preventing the electronic device EL from being triggered unexpectedly by being touched with the face.

Figure 4A:
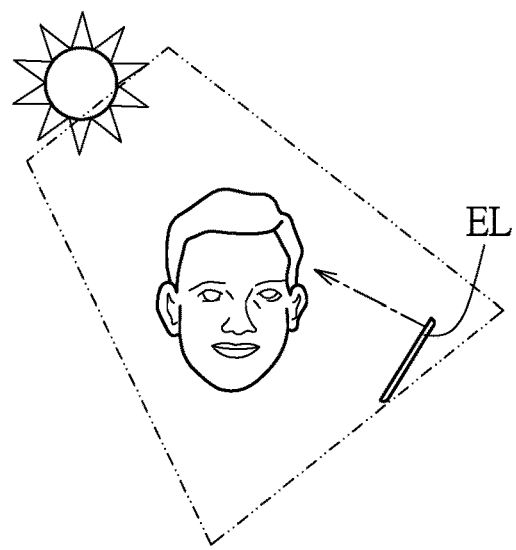
FIG. 4A is a schematic diagram of the proximity sensor with the sliced integration time sensing mechanism for sensing that the electronic device gradually approaches the human body over time according to a second embodiment of the present disclosure.
Figure 4B:
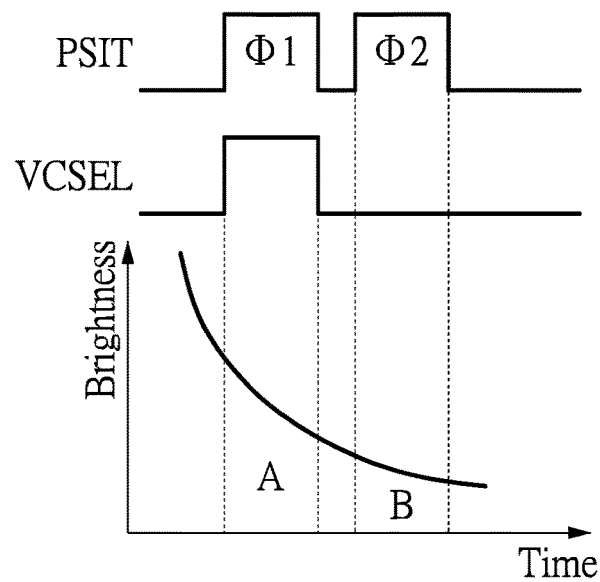
FIG. 4B is a schematic diagram of waveforms of an integration time signal and a light emitting signal of the proximity sensor with the sliced integration time sensing mechanism and a curve of a light signal versus time according to the second embodiment of the present disclosure.
Figure 4C:
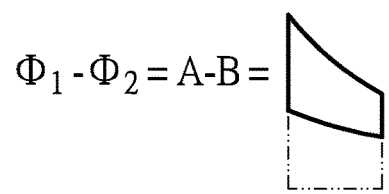
FIG. 4C is a schematic diagram of a second integrated brightness area subtracted from a first integrated brightness area of FIG. 4B.

Reference is made to FIGS. 4A, 4B and 4C, wherein FIG. 4A is a schematic diagram of the proximity sensor with the sliced integration time sensing mechanism sensing the electronic device gradually approaching the human body over time according to a second embodiment of the present disclosure, FIG. 4B is a schematic diagram of waveforms of an integration time signal and a light emitting signal of the proximity sensor with the sliced integration time sensing mechanism and a curve of a light signal versus time according to the second embodiment of the present disclosure, and FIG. 4C is a schematic diagram of a second integrated brightness area subtracted from a first integrated brightness area of FIG. 4B.

In the embodiment, the proximity sensor with the sliced integration time sensing mechanism includes a light transmitter and a light receiver. The proximity sensor is disposed in the electronic device EL shown in FIG. 4A and applicable to sense the distance between the electronic device EL and the detected object such as the human body. As shown in FIG. 4A, the electronic device EL in which the proximity sensor of the embodiment is disposed gradually approaches the detected object over time. It should be understood that, the smaller the distance between the electronic device EL and the detected object is, the larger an area of the electronic device EL that is blocked by the detected object is, and the smaller the brightness of the ambient light emitted to the light receiver blocked by the detected object is.

As shown in FIG. 4B, the integration time signal PSIT is divided into the first phase time Φ1 and the second phase time Φ2. In the embodiment, a time length of the first phase time Φ1 is equal to a time length of the second phase time Φ2, but the present disclosure is not limited thereto. In practice, the integration time signal PSIT may be divided into more phase times, and a time length of each of the phase times can be determined according to actual requirements.

As shown in FIG. 4B, the light emitting signal VCSEL is at a high level during the first phase time Φ1, which indicates that the sensing light is emitted by the light transmitter toward the detected object and then reflected to the light receiver by the detected object, and the ambient light from the ambient light source is received by the light receiver, during the first phase time Φ1.

As shown in FIG. 4B, the brightness of the light signal received by the light receiver increases over time to form the curve in a curve diagram of brightness versus time. The curve includes a first curve section. The light receiver receives the first light signal formed by the sensing light emitted by the light transmitter and the ambient light during the first phase time Φ1. The first brightness of the first light signal changes over time to form the first curve section during the first phase time Φ1, and a region under the first curve section has a first integrated brightness area A. That is, the first brightness is integrated over the first phase time Φ1 to form the first integrated brightness area A, a magnitude of which is a first integrated brightness value.

When the first phase time Φ1 ends, the light emitting signal VCSEL changes from a high level to a low level and enters the second phase time Φ2. During the second phase time Φ2, the light transmitter does not emit any light, and the light receiver only receives the second light signal formed by the ambient light.

As shown in FIG. 4B, the curve further includes a second curve section in the curve diagram. The second brightness of the second light signal received by the light receiver changes over time to form the second curve section during the second phase time Φ2, and a region under the second curve section has a second integrated brightness area B. That is, the second brightness is integrated over the second phase time Φ2 to form the second integrated brightness area B, a size of which is a second integrated brightness value.

As shown in FIGS. 4B and 4C, the light receiver is configured to subtract the second integrated brightness area B from the first integrated brightness area A to obtain the first integrated brightness correction area A, by the phase cancellation manner. A size of the first integrated brightness correction area A is the first integrated brightness correction value, which accounts for only the brightness of the sensing signal emitted by the light transmitter over time, without the brightness of the ambient light.

Reference is made to FIGS. 5A, 5B and 5C, wherein FIG. 5A is a schematic diagram of a proximity sensor with a sliced integration time sensing mechanism for sensing that an electronic device gradually moves away from a human body over time according to a third embodiment of the present disclosure, FIG. 5B is a schematic diagram of waveforms of an integration time signal and a light emitting signal of the proximity sensor with the sliced integration time sensing mechanism and a curve of a light signal versus time according to the third embodiment of the present disclosure, and FIG. 5C is a schematic diagram of a second integrated brightness area subtracted from a first integrated brightness area of FIG. 5B.

In the embodiment, the proximity sensor with the sliced integration time sensing mechanism includes the light transmitter and the light receiver. The proximity sensor is disposed in the electronic device EL shown in FIG. 5 and applicable to sense the distance between the electronic device EL and the detected object such as the human body. As shown in FIG. 5, the electronic device EL in which the proximity sensor of the embodiment is disposed gradually moves away from the detected object over time. It is should be understood that, the larger the distance between the electronic device EL and the detected object is, the smaller an area of the electronic device EL that is blocked by the detected object is, and the larger the brightness of the ambient light emitted to the light receiver is.

As shown in FIG. 5B, the integration time signal PSIT is divided into the first phase time Φ1 and the second phase time Φ2. In the embodiment, the time length of the first phase time Φ1 is equal to the time length of the second phase time Φ2, but the present disclosure is not limited thereto. In practice, the integration time signal PSIT may be divided into more phase times and the time length of each of the phase times can be determined according to actual requirements.

As shown in FIG. 5B, the light emitting signal VCSEL is at a high level during the first phase time Φ1, which indicates that the sensing light is emitted by the light transmitter toward the detected object and then reflected to the light receiver by the detected object, during the first phase time Φ1. At the same time, the light receiver receives the ambient light from the ambient light source.

As shown in FIG. 5B, the brightness of the light signal received by the light receiver decreases over time to form the curve in a curve diagram of brightness versus time. For convenience of explanation, the curve is defined to include a first curve section. The light receiver receives the first light signal formed by the sensing light emitted by the light transmitter and the ambient light during the first phase time Φ1. The first brightness of the first light signal changes over time to form the first curve section during the first phase time Φ1, and a region under the first curve section has the first integrated brightness area A. That is, the first brightness is integrated over the first phase time Φ1 to form the first integrated brightness area A, a size of which is a first integrated brightness value.

When the first phase time Φ1 ends, the light emitting signal VCSEL changes from a high level to a low level and enters the second phase time Φ2. During the second phase time Φ2, the light transmitter only receives the second light signal formed by the ambient light.

For convenience of explanation, the curve is defined to further include a second curve section. The second brightness of the second light signal received by the light receiver changes over time to form the second curve section during the second phase time Φ2, and a region under the second curve section has the second integrated brightness area B. That is, the second brightness is integrated over the second phase time Φ2 to form the second integrated brightness area B, a size of which is a second integrated brightness value.

As shown in FIG. 5B, a first brightness of the first light signal is integrated over the first phase time Φ1 to form the first integrated brightness area A, and a second brightness of the second light signal is integrated over the second phase time Φ2 to form the second integrated brightness area B. As shown in FIG. 5C, the light receiver RX subtracts the second integrated brightness area B from the first integrated brightness area A to obtain a first integrated brightness correction area, by using the phase cancellation manner.

Figure 6A:
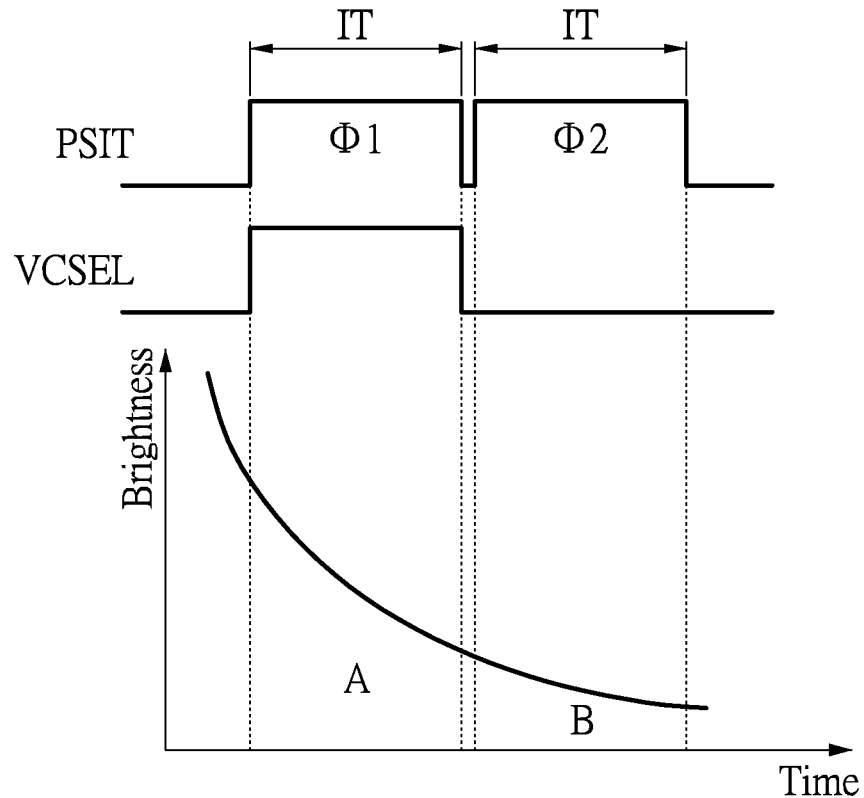
FIG. 6A is a schematic diagram of waveforms of an integration time signal and a light emitting signal of a proximity sensor with a sliced integration time sensing mechanism and a curve of a light signal versus time according to a fourth embodiment of the present disclosure.
Figure 6B:
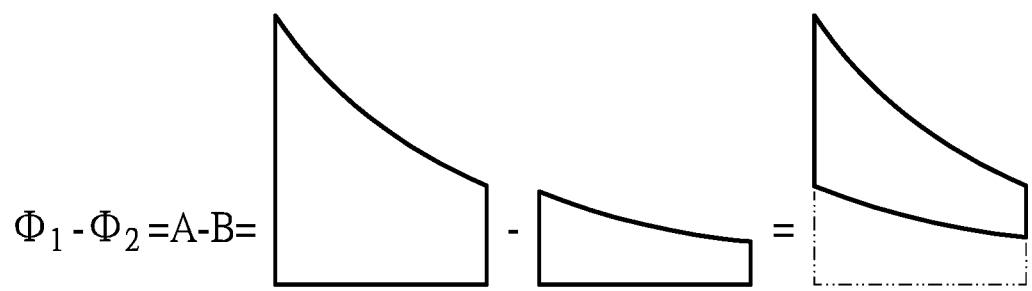
FIG. 6B is a schematic diagram of a second integrated brightness area subtracted from a first integrated brightness area of FIG. 6A.

Reference is made to FIGS. 6A and 6B, wherein FIG. 6A is a schematic diagram of waveforms of an integration time signal and a light emitting signal of a proximity sensor with a sliced integration time sensing mechanism and a curve of a light signal versus time according to a fourth embodiment of the present disclosure, and FIG. 6B is a schematic diagram of a second integrated brightness area subtracted from a first integrated brightness area of FIG. 6A. Similar descriptions of the second and the fourth embodiments are not repeated herein.

A difference between the second and the fourth embodiments is that, in the fourth embodiment, as shown in FIGS. 6A and 6B, the integration time signal is divided into the first phase time Φ1 and the second phase time Φ2, each having a time length IT longer than that in the second embodiment shown in FIGS. 4A and 4B. As a result, the first integrated brightness area A formed by integrating the first brightness of the first light signal over the first phase time Φ1 increases, and the second integrated brightness area B formed by integrating the second brightness of the second light signal over the second phase time Φ2 increases. The light receiver subtracts the second integrated brightness area B from the first integrated brightness area A to obtain the first integrated brightness correction area shown in FIG. 6B, which is larger than the first integrated brightness correction area shown in FIG. 4C.

The first phase time Φ1 and the second phase time Φ2 in the embodiments are merely examples, and the present disclosure is not limited thereto. In practice, the number and the length of the phase times divided by the integration time may be determined according to actual requirements, such as a speed of the ambient light over time, to accurately determine the distance between the detected object and the electronic device in which the proximity sensor is disposed.

Figure 7A:
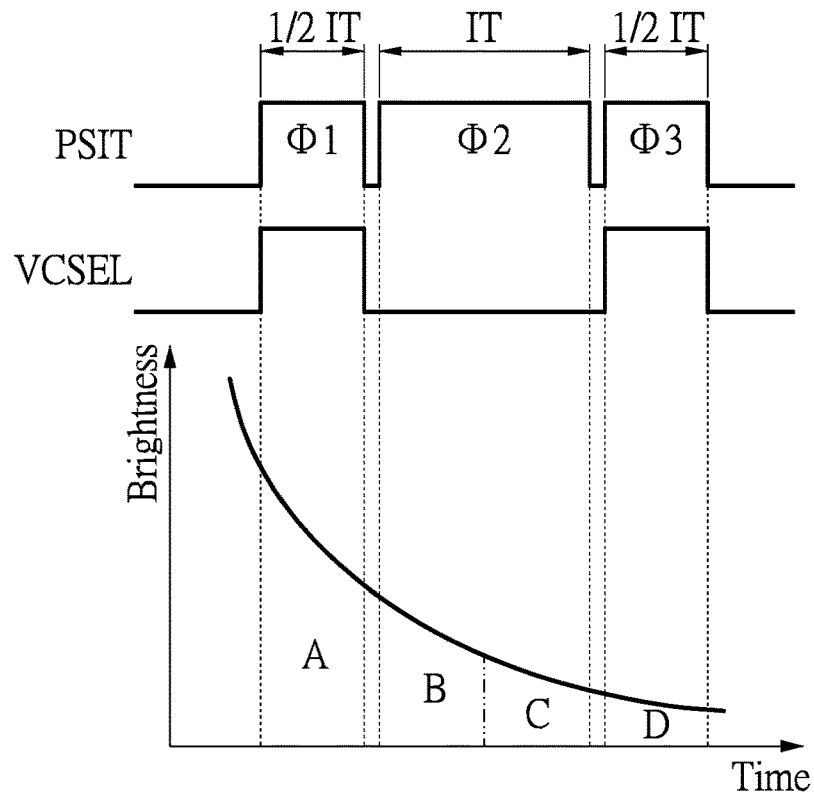
FIG. 7A is a schematic diagram of waveforms of an integration time signal and a light emitting signal of a proximity sensor with a sliced integration time sensing mechanism and a curve of a light signal versus time according to a fifth embodiment of the present disclosure.
Figure 7B:
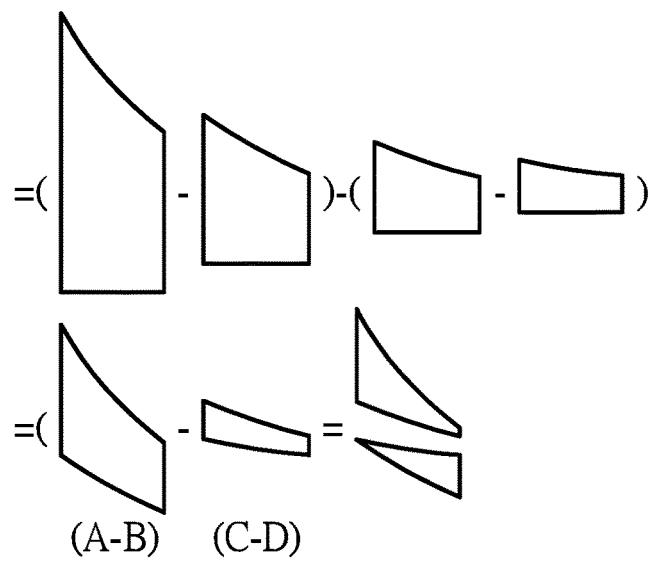
FIG. 7B is a schematic diagram of a second integrated brightness area subtracted from a first integrated brightness area of FIG. 7A.

Reference is made to FIGS. 7A and 7B, wherein FIG. 7A is a schematic diagram of waveforms of an integration time signal and a light emitting signal of a proximity sensor with a sliced integration time sensing mechanism and a curve of a light signal versus time according to a fifth embodiment of the present disclosure, and FIG. 7B is a schematic diagram of a second integrated brightness area subtracted from a first integrated brightness area of FIG. 7A. In comparison with a two-phase cancellation manner applied in the fourth embodiment shown in FIGS. 6A and 6B, a three-phase cancellation manner is applied in the embodiment shown in FIGS. 7A and 7B to more effectively eliminate the brightness of the ambient light, which is described specifically as follows.

As shown in FIG. 7A, the integration time signal PSIT is divided into the first phase time Φ1, the second phase time Φ2 and a third phase time Φ3. In the embodiment, a sum of the time length of the first phase time Φ1 and a time length of the third phase time Φ3 is equal to the time length IT of the second phase time Φ2. That is, the time length of the first phase time Φ1 is half the time length IT of the second phase time Φ2, and the time length of the third phase time Φ3 is half the time length IT of the second phase time Φ2.

As shown in FIG. 7A, the brightness of the light signal received by the light receiver increases over time to form the curve in a curve diagram of brightness versus time. For convenience of explanation, the curve is defined to include a first curve section, a second curve section, a third curve section and a fourth curve section.

As shown in FIG. 7A, the light emitting signal VCSEL is at a high level during the first phase time Φ1, which indicates that the sensing light is emitted by the light transmitter toward the detected object, and then reflected by the detected object to form the first light signal with the ambient light emitted by the ambient light source to the light receiver, during the first phase time Φ1.

The first brightness of the first light signal changes over time to form the first curve section during the first phase time Φ1, and a region under the first curve section has the first integrated brightness area A. That is, the first brightness is integrated over the first phase time Φ1 to form the first integrated brightness area A.

As shown in FIG. 7A, during the second phase time Φ2, the light emitting signal VCSEL is at a low level during the second phase time Φ2, which indicates that the light transmitter does not emit any light, and the light receiver only receives the second light signal formed by the ambient light of the ambient light source.

The first brightness of the second light signal changes over one half of the second phase time Φ2 to form the second curve section, and successively changes over the other half of the second phase time Φ2 to form the third curve section. A region under the second curve section has the second integrated brightness area B. A region under the third curve section has a third integrated brightness area C. That is, the second brightness of the second light signal is integrated over the second integration time IT to form the second integrated brightness area B and the third integrated brightness area C.

As shown in FIG. 7A, the light emitting signal VCSEL is at a high level during the third phase time Φ3, which indicates that the sensing light is emitted by the light transmitter toward the detected object and then reflected by the detected object to form a third light signal with the ambient light emitted by the ambient light source to the light receiver, during the third phase time Φ3. The third brightness of the third light signal changes over time to form a fourth curve section during the third phase time Φ3, and a region under the fourth curve section has a fourth integrated brightness area D. That is, the third brightness of the third light signal is integrated over the third phase time Φ3 to form the fourth integrated brightness area D.

As shown in FIG. 7B, the light receiver is configured to subtract the second integrated brightness area B and the third integrated brightness area C of the second phase time Φ2 from a sum of the first integrated brightness area A of the first phase time Φ1 and the fourth integrated brightness area D of the third phase time Φ3 by the phase cancellation manner to obtain a second integrated brightness correction area, a size of which is a second integrated brightness correction value.

Figure 8A:
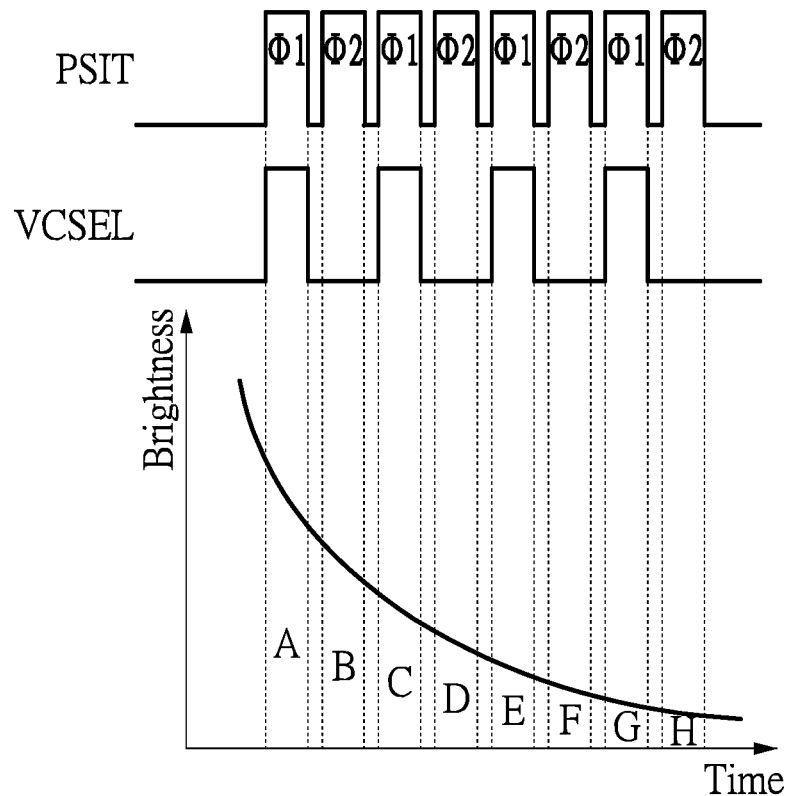
FIG. 8A is a schematic diagram of waveforms of an integration time signal and a light emitting signal of a proximity sensor with a sliced integration time sensing mechanism and a curve of a light signal versus time according to a sixth embodiment of the present disclosure.
Figure 8B:
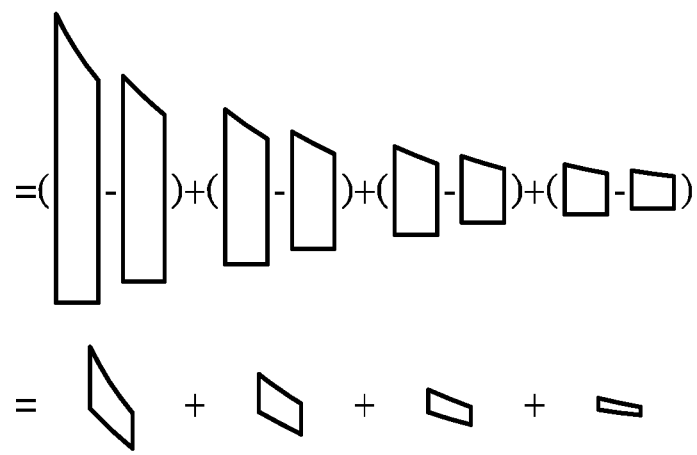
FIG. 8B is a schematic diagram of a second integrated brightness area subtracted from a first integrated brightness area of FIG. 8A.

Reference is made to FIG. 8A and FIG. 8B, wherein FIG. 8A is a schematic diagram of waveforms of an integration time signal and a light emitting signal of a proximity sensor with a sliced integration time sensing mechanism and a curve of a light signal versus time according to a sixth embodiment of the present disclosure, and FIG. 8B is a schematic diagram of a second integrated brightness area subtracted from a first integrated brightness area of FIG. 8A.

As shown in FIG. 8A, the integration time of the integration time signal PSIT is divided into the first phase time Φ1 and the second phase time Φ2. Further, the first phase time Φ1 is divided into a plurality of first sub-phase times that are discontinuous relative to each other. Further, the second phase time Φ2 is divided into a plurality of second sub-phase times that are discontinuous relative to each other. The first sub-phase times are interleaved with the second sub-phase times.

In the embodiment, the time length of the first phase time Φ1 is equal to the time length of the second phase time Φ2, and a time length of each of the first sub-phase times is equal to a time length of each of the second sub-phase times, but the present disclosure is not limited thereto.

As shown in FIG. 8A, the light emitting signal VCSEL is at a high level during each of the first sub-phase times of the first phase time $\Phi 1$, which indicates that the sensing light is emitted by the light transmitter toward the detected object and then reflected to the light receiver by the detected object. The light receiver receives the first light signal formed by the sensing light and the ambient light of the ambient light source.

Conversely, the light emitting signal VCSEL is at a low level during each of the second sub-phase times of the second phase time $\Phi 2$, which indicates that the light transmitter does not emit any light. Under this condition, the light receiver only receives the second light signal formed by the ambient light.

As shown in FIG. 8A, the brightness of the light signal received by the light receiver changes over time to form the curve in a curve diagram of brightness versus time. The first brightness of the first light signal is integrated over the first sub-phase times respectively to form the first integrated brightness area A, the third integrated brightness area C, a fifth integrated brightness area E and a seventh integrated brightness area G during the first phase time $\Phi 1$.

The second brightness of the second light signal is integrated over the second sub-phase times respectively to form the second integrated brightness area B, the fourth third integrated brightness area D, a sixth third integrated brightness area F and an eighth integrated brightness area H during the second phase time $\Phi 2$.

As shown in FIG. 8B, the light receiver subtracts the second integrated brightness area B, the fourth third integrated brightness area D, the sixth third integrated brightness area F and the eighth integrated brightness area H, from the first integrated brightness area A, the third integrated brightness area C, the fifth integrated brightness area E and the seventh integrated brightness area G, to obtain a first integrated brightness correction area, a size of which is a first integrated brightness correction value.

Figure 9A:
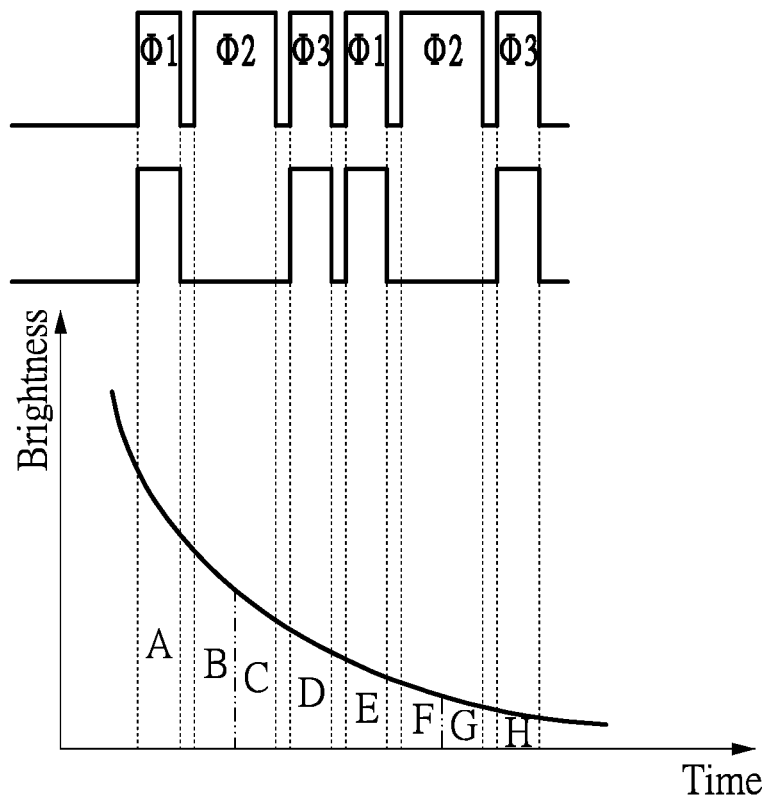
FIG. 9A is a schematic diagram of waveforms of an integration time signal and a light emitting signal of a proximity sensor with a sliced integration time sensing mechanism and a curve of a light signal versus time according to a seventh embodiment of the present disclosure.
Figure 9B:
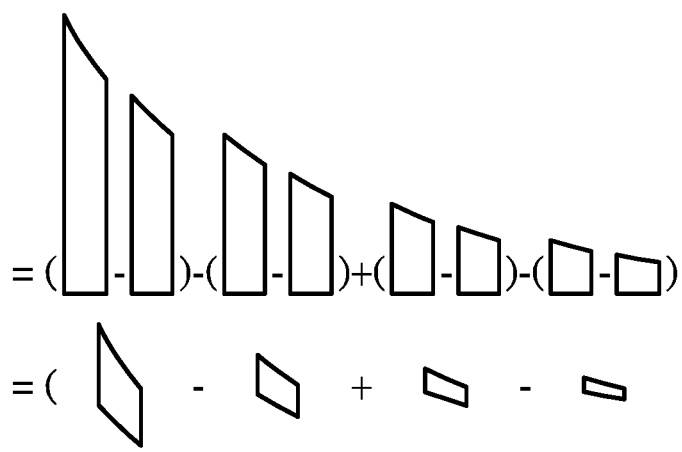
FIG. 9B is a schematic diagram of a second integrated brightness area subtracted from a first integrated brightness area of FIG. 9A.

Reference is made to FIGS. 9A and 9B, wherein FIG. 9A is a schematic diagram of waveforms of an integration time signal and a light emitting signal of a proximity sensor with a sliced integration time sensing mechanism and a curve of a light signal versus time according to a seventh embodiment of the present disclosure, and FIG. 9B is a schematic diagram of a second integrated brightness area subtracted from a first integrated brightness area of FIG. 9A.

In the seventh embodiment, as shown in FIG. 9A, the integration time of the integration time signal PSIT is divided into more phase times, such as two groups of the first phase time $\Phi 1$, the second phase time $\Phi 2$ and the third phase time $\Phi 3$, each of which has a time length that is shorter than that in the fifth embodiment shown in FIG. 7A.

In the embodiment, as shown in FIG. 9A, in each of the groups, the time length of the second phase time $\Phi 2$ is equal to a sum of the time length of the first phase time $\Phi 1$ and the time length of the third phase time $\Phi 3$. That is, the time length of the first phase time $\Phi 1$ is only half the time length of the second phase time $\Phi 2$, and the time length of the third phase time $\Phi 3$ is only half the time length of the second phase time $\Phi 2$.

As shown in FIG. 9A, the light emitting signal VCSEL is at a high level during each of the first phase times $\Phi 1$ and each of the third phase times $\Phi 3$, which indicates that the sensing light is emitted by the light transmitter toward the detected object and then reflected by the detected object to the light receiver. The light receiver receives the first light signal formed by the sensing light and the ambient light of the ambient light.

Conversely, the light emitting signal VCSEL is at a low level during the second phase time $\Phi 2$, which indicates that the light transmitter does not emit any light. Under this condition, the light receiver only receives the second light signal formed by the ambient light.

As shown in FIG. 9A, the brightness of the light signal received by the light receiver changes over time to form the curve in a curve diagram of brightness versus time. The first brightness of the first light signal is integrated over the first phase times $\Phi 1$ respectively to form the first integrated brightness area A and the fifth integrated brightness area E. The second brightness of the second light signal is integrated over the second phase times $\Phi 2$ respectively to form the second integrated brightness area B, the third integrated brightness area C, the sixth third integrated brightness area F and the seventh integrated brightness area G. The third brightness of the third light signal is integrated over the third phase times $\Phi 3$ respectively to form the fourth integrated brightness area D and the eighth integrated brightness area H.

As shown in FIG. 9B, the light receiver subtracts the second integrated brightness area B, the third integrated brightness area C, the sixth third integrated brightness area F and the seventh integrated brightness area G from a sum of the first integrated brightness area A, the fourth third integrated brightness area D, the fifth integrated brightness area E and the eighth integrated brightness area H, to obtain a second integrated brightness correction area, a size of which is a second integrated brightness correction value. In this way, the brightness of the ambient light is eliminated by the phase cancellation manner. An order of these mathematical operations may depend on an order of the phase times.

As shown in FIG. 9B, in the seventh embodiment, the integration time is divided into more phase times than that in the fifth embodiment shown in FIG. 7B. As a result, the brightness value of the ambient light is more accurately subtracted to obtain the second integrated brightness area B that is smaller than that in the fifth embodiment shown in FIG. 7B.

Figure 10:
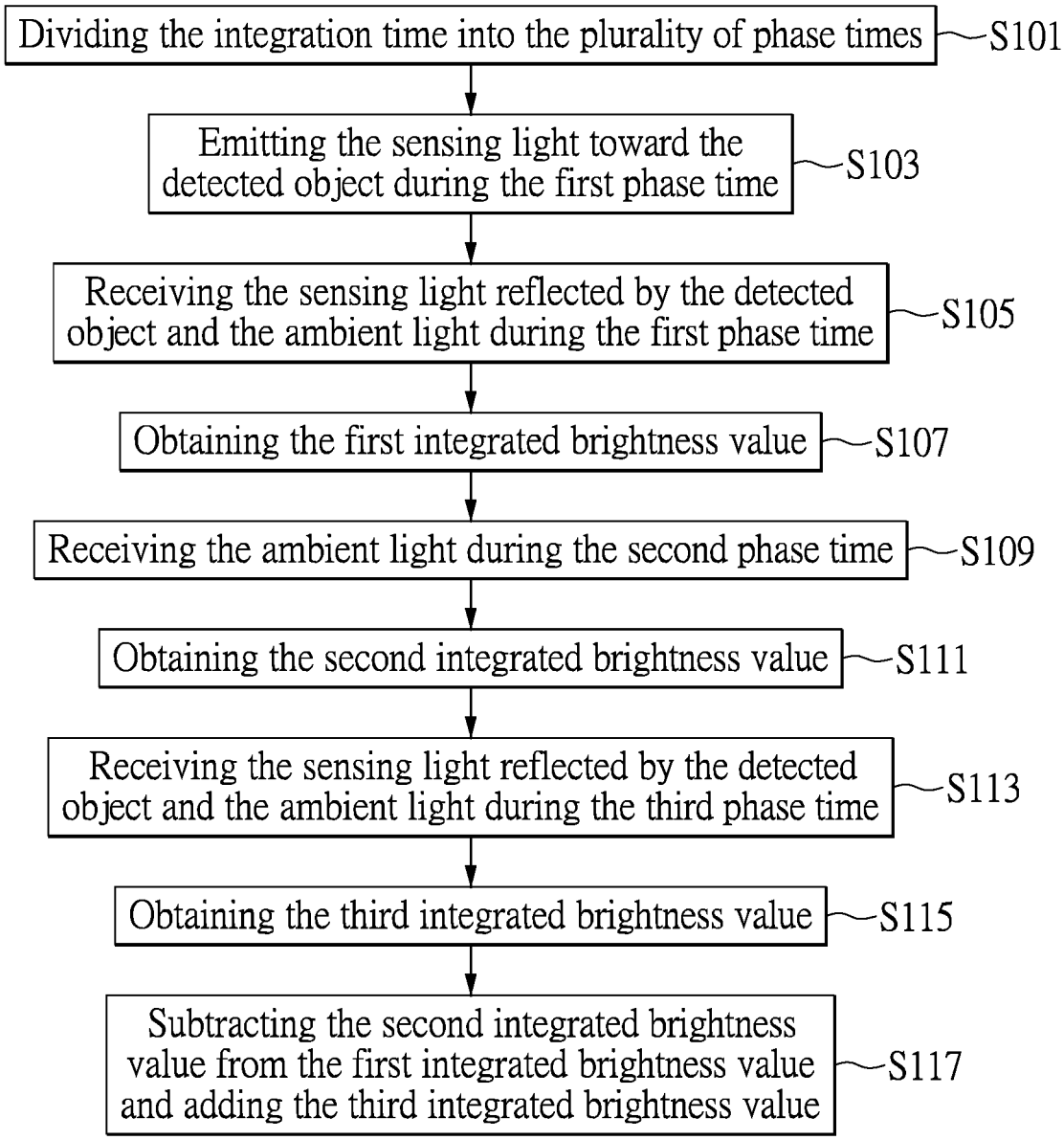
FIG. 10 is a flowchart diagram of steps of a slice integration time sensing method for a proximity sensor according to an eighth embodiment of the present disclosure.

Reference is made to FIG. 10, which is a flowchart diagram of steps of a slice integration time sensing method for a proximity sensor according to an eighth embodiment of the present disclosure.

In the embodiment, as shown in FIG. 10, the slice integration time sensing method includes steps S101 to S117, which is applicable for the proximity sensor disposed in the electronic device to sense the distance between the electronic device and the detected object, as described specifically as follows. It should be understood that, if necessary, the procedures in the steps may be adjusted appropriately according to other embodiments such as the seventh embodiment shown in FIGS. 9A and 9B.

In step S101, the integration time of the integration time signal PSIT is divided into the plurality of phase times, such as the first phase time $\Phi 1$, the second phase time $\Phi 2$ and the third phase time $\Phi 3$ as shown in FIG. 7A.

In step S103, the light transmitter of the proximity sensor emits the sensing light toward the detected object during the first phase time $\Phi 1$.

In step S105, the light receiver of the proximity sensor receives the first light signal formed by the sensing light reflected by the detected object and the ambient light during the first phase time $\Phi 1$.

In step S107, the light receiver of the proximity sensor obtains the first integrated brightness value, which is formed by integrating the first brightness of the first light signal over the first phase time Φ1.

In step S109, the light receiver of the proximity sensor receives the second light signal of the ambient light during the second phase time Φ2.

In step S111, the light receiver of the proximity sensor obtains the second integrated brightness value, which is formed by integrating the second brightness of the second light signal over the second phase time Φ2.

In step S113, the light receiver of the proximity sensor receives the third light signal formed by the sensing light reflected by the detected object and the ambient light during the third phase time Φ3.

In step S115, the light receiver of the proximity sensor obtains the third integrated brightness value, which is formed by integrating the third brightness of the third light signal over the third phase time Φ3.

In step S117, the light receiver of the proximity sensor subtracts the second integrated brightness value from a sum of the first integrated brightness value and the third integrated brightness value to obtain the second integrated brightness correction value of the second integrated brightness correction area.

Figure 11:
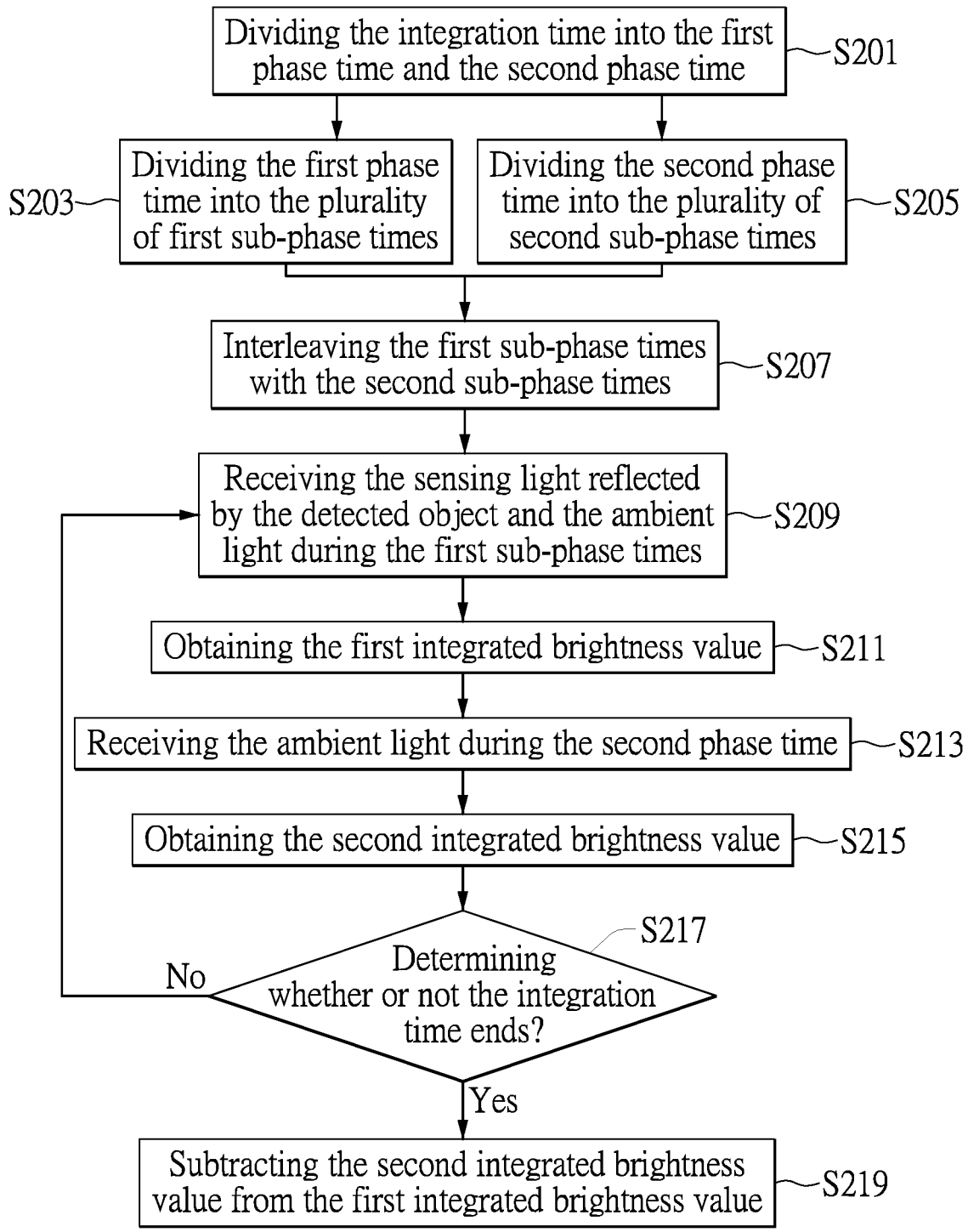
FIG. 11 is a flowchart diagram of steps of a slice integration time sensing method for a proximity sensor according to a ninth embodiment of the present disclosure.

Reference is made to FIG. 11, which is a flowchart diagram of steps of a slice integration time sensing method for a proximity sensor according to a ninth embodiment of the present disclosure.

In the embodiment, as shown in FIG. 11, the slice integration time sensing method includes steps S201 to S219, which is applicable for the proximity sensor disposed in the electronic device to sense the distance between the electronic device and the detected object, as described specifically as follows. It should be understood that, if necessary, the procedures in the steps may be adjusted appropriately according to other embodiments such as seventh embodiment shown in FIGS. 6A and 6B.

In step S201, the integration time of the integration time signal PSIT is divided into the first phase time Φ1 and the second phase time Φ2 as shown in FIG. 8A. In step S203, the first phase time Φ1 is divided into the plurality of first sub-phase times. In step S205, the second phase time Φ2 is divided into the plurality of second sub-phase times.

In step S207, the first sub-phase times of the first phase time Φ1 are interleaved with the second sub-phase times of the second phase time Φ2.

In step S209, the light receiver of the proximity sensor receives the first light signal formed by the sensing light reflected by the detected object and the ambient light of the ambient light source during one of the first sub-phase times of the first phase time Φ1.

In step S211, the light receiver of the proximity sensor receives first integrated sub-brightness values, each of which is formed by integrating the first brightness of the first light signal over each of the first sub-phase times.

In step S213, the light receiver of the proximity sensor receives the second light signal of the ambient light during one of the second sub-phase times of the second phase time Φ2.

In step S215, the light receiver of the proximity sensor receives second integrated sub-brightness values, each of which is formed by integrating the second brightness of the second light signal over each of the second sub-phase times.

In step S217, the light receiver of the proximity sensor determines whether or not the integration time has ended. If the light receiver determines that the integration time has not ended, steps S209 to S215 are performed sequentially and repeatedly. If the light receiver determines that the integration time has ended, step S219 is performed.

In step S219, the light receiver of the proximity sensor subtracts the second integrated sub-brightness values during all the second sub-phase times of the second phase time Φ2, from the first integrated sub-brightness values during all the first sub-phase times of the first phase time Φ1, to eliminate the brightness of the ambient light by the phase cancellation manner to obtain the first integrated brightness correction area, a size of which is a first integrated brightness correction value.

In summary, the present disclosure provides the proximity sensor with the sliced integration time sensing mechanism and the sensing method thereof. The integration time is divided into the plurality of phase times such as two, three or more phase times. The light transmitter emits the sensing light and the light receiver receives the light signal formed by the sensing signal reflected by the detected object and the ambient light during a specific phase time. The light receiver only receives the light signal formed by the ambient light during other phase times. Finally, the brightness of the ambient light is optimally eliminated from the brightness of the light signals formed during the plurality of phase times by the phase cancellation manner such as the two-phase or three-phase cancellation manner.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A proximity sensor with a sliced integration time sensing mechanism, wherein the proximity sensor is disposed in an electronic device and applicable to sense a distance between the electronic device and a detected object, the proximity sensor comprising:

a light transmitter configured to emit a sensing light toward the detected object during a first phase time, wherein an integration time indicated by an integration time signal is divided into a plurality of phase times including the first phase time and a second phase time; and a light receiver disposed in a path along which the sensing light is reflected by the detected object, configured to receive a first light signal formed by the sensing light reflected by the detected object and an ambient light during the first phase time, and configured to receive a second light signal of the ambient light during the second phase time;

wherein a first brightness of the first light signal is integrated over the first phase time to form a first integrated brightness value, a second brightness of the second light signal is integrated over the second phase time to form a second integrated brightness value, and the light receiver is configured to subtract the second integrated brightness value from the first integrated brightness value to obtain a first integrated brightness correction value by phase cancellation.

2. The proximity sensor according to claim 1, wherein the phase times have the same time length.

3. The proximity sensor according to claim 1, wherein the plurality of phase times further includes a third phase time;
wherein the light transmitter is configured to emit the sensing light toward the detected object during the third phase time;
wherein the light receiver is configured to receive a third light signal formed by the sensing light reflected by the detected object and the ambient light during the third phase time;
wherein a third brightness of the third light signal is integrated over the third phase time to form a third integrated brightness value, and the light receiver is configured to calculate a sum of the first integrated brightness correction value and the third integrated brightness value to obtain a second integrated brightness correction value.

4. The proximity sensor according to claim 3, wherein a time length of the second phase time is equal to a sum of a time length of the first phase time and a time length of the third phase time.

5. The proximity sensor according to claim 1, wherein the first phase time is divided into a plurality of first sub-phase times, the second phase time is divided into a plurality of second sub-phase times, and the first sub-phase times are interleaved with the second sub-phase times.

6. A slice integration time sensing method for a proximity sensor, wherein the proximity sensor is disposed in an electronic device and applicable to sense a distance between the electronic device and a detected object, the slice integration time sensing method comprising the following steps:
dividing an integration time indicated by an integration time signal into a first phase time and a second phase time;
emitting a sensing light toward the detected object during the first phase time;
receiving a first light signal formed by the sensing light reflected by the detected object and an ambient light, during the first phase time;
receiving a second light signal of the ambient light during the second phase time; and
integrating a first brightness of the first light signal over the first phase time to obtain a first integrated brightness value, integrating a second brightness of the second light signal over the second phase time to obtain a second integrated brightness value, and subtracting the second integrated brightness value from the first integrated brightness value to obtain a first integrated brightness correction value by phase cancellation.

7. The slice integration time sensing method according to claim 6, further comprising a step of:
dividing the integration time into the phase times have the same time length.

8. The slice integration time sensing method according to claim 6, further comprising steps of:
dividing the integration time into the first phase time, the second phase time and a third phase time;
emitting the sensing light toward the detected object during the third phase time;
receiving a third light signal formed by the sensing light reflected by the detected object and the ambient light, during the third phase time; and
integrating a third brightness of the third light signal over the third phase time to obtain a third integrated brightness value, and calculating a sum of the first integrated brightness correction value and the third integrated brightness value.

9. The slice integration time sensing method according to claim 8, wherein a time length of the second phase time is equal to a sum of a time length of the first phase time and a time length of the third phase time.

10. The slice integration time sensing method according to claim 6, further comprising steps of:
dividing the first phase time into a plurality of first sub-phase times;
dividing the second phase time into a plurality of second sub-phase times; and
interleaving the first sub-phase times with the second sub-phase times.

* * * * *